US008023232B2

(12) United States Patent
Sbiaa et al.

(10) Patent No.: US 8,023,232 B2
(45) Date of Patent: Sep. 20, 2011

(54) FILM AND METHOD FOR PRODUCING NANO-PARTICLES FOR MAGNETORESISTIVE DEVICE

(75) Inventors: Rachid Sbiaa, Tokyo (JP); Isamu Sato, Tokyo (JP); Haruyuki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 577 days.

(21) Appl. No.: 12/179,293

(22) Filed: Jul. 24, 2008

(65) Prior Publication Data

US 2009/0009915 A1  Jan. 8, 2009

Related U.S. Application Data

(62) Division of application No. 10/998,597, filed on Nov. 30, 2004, now abandoned.

(51) Int. Cl.
*G11B 5/39* (2006.01)
(52) U.S. Cl. .................................................. 360/324.1
(58) Field of Classification Search .............. 360/324.1
See application file for complete search history.

(56) References Cited

U.S. PATENT DOCUMENTS

| | | | |
|---|---|---|---|
| 5,302,469 A * | 4/1994 | Sugenoya et al. ............ 428/812 |
| 6,341,053 B1 | 1/2002 | Nakada et al. | |
| 6,454,910 B1 | 9/2002 | Zhurin et al. | |
| 6,623,857 B2 | 9/2003 | Watanabe et al. | |
| 6,785,099 B2 * | 8/2004 | Lee et al. ...................... 360/319 |
| 7,180,713 B2 | 2/2007 | Naaasaka et al. | |
| 2004/0023073 A1 | 2/2004 | Shimizu et al. | |

FOREIGN PATENT DOCUMENTS

JP          9289345 A    11/1997

OTHER PUBLICATIONS

S.J. Guilfoyle et al, University of Salford, UK ; Low Energy Ion Beam Assisted Deposition and GMR of Granular Magnetic Alloys, Jul. 6, 1995, pp. 29-33.*
Physical Review B67,060401; The American Physical Society 2003.
Physical Review letters vol. 83, 2030-203, The American Physical Society 1999.
Physical Review letter vol. 83, 2923-2926, The American Physical Society 1999.
Jiang et al. "Magnetic properties of FeSi-SiO2 granular films", J. Appl. Phys. 76 (10), Nov. 15. 1994, pp. 6494-6492).

* cited by examiner

*Primary Examiner* — Mark Blouin
(74) *Attorney, Agent, or Firm* — Sughrue Mion, PLLC

(57) ABSTRACT

A method of generating a thin film for use in a spin valve of a magnetoresistive (MR) sensor having a nano-constricted spacer is provided. The bottom portion of the spin valve is deposited up to the pinned layer, a deposition chamber is provided, and the spacer layer is sputtered thereon. A main ion beam generates ions onto a composite surface including magnetic chips and insulator material. Simultaneously, an assisted ion beam provides ions directly to the substrate, thus improving the softness of the free layer and smoothness of the spacer layer. Neutralizers are also provided to prevent ion repulsion and improve ion beam focus. As a result, a thin film spacer can be formed, and the nano-constricted MR spin valve having low free layer coercivity and low interlayer coupling between the free layer and pinned layer is formed.

15 Claims, 8 Drawing Sheets

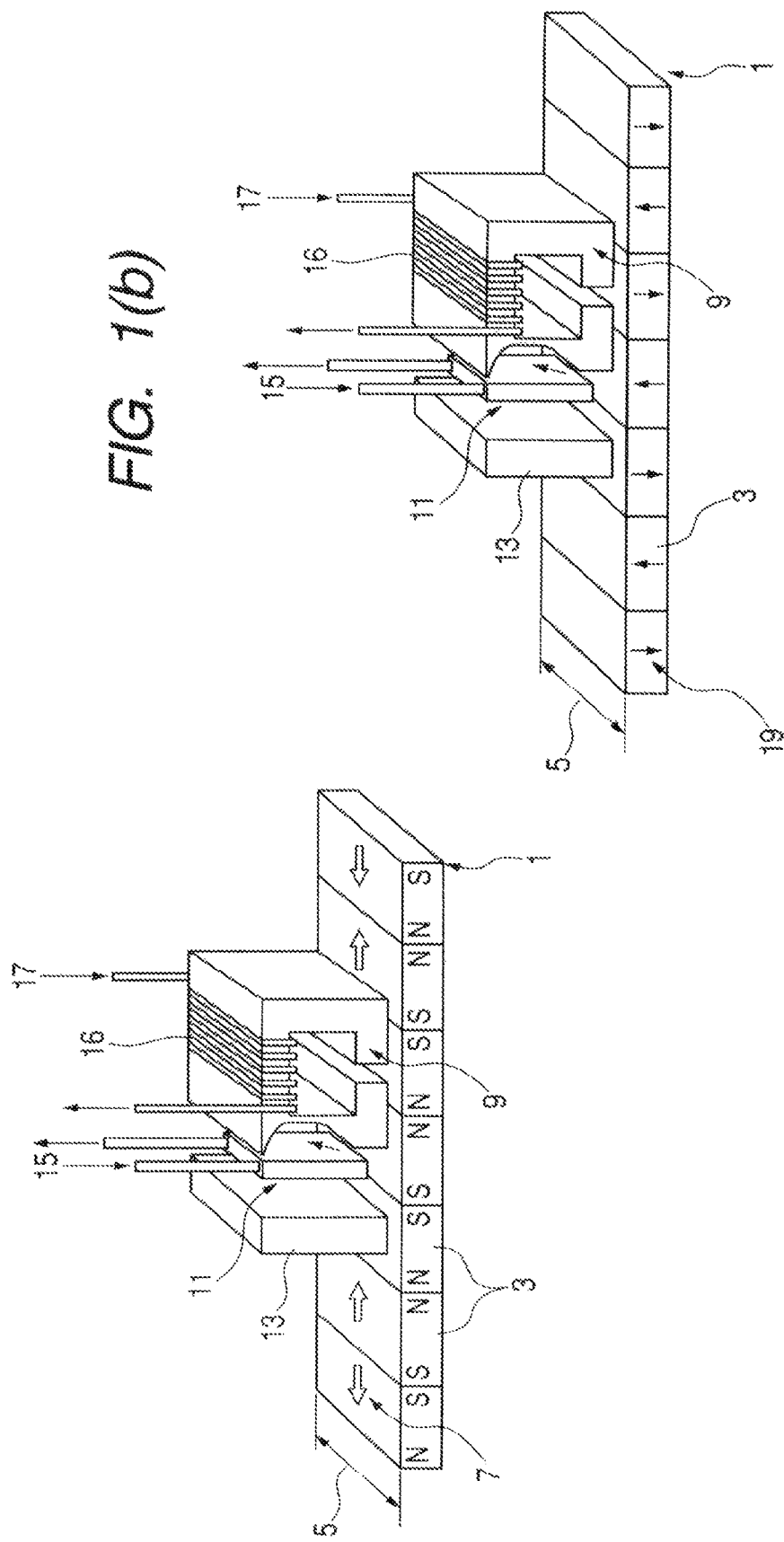

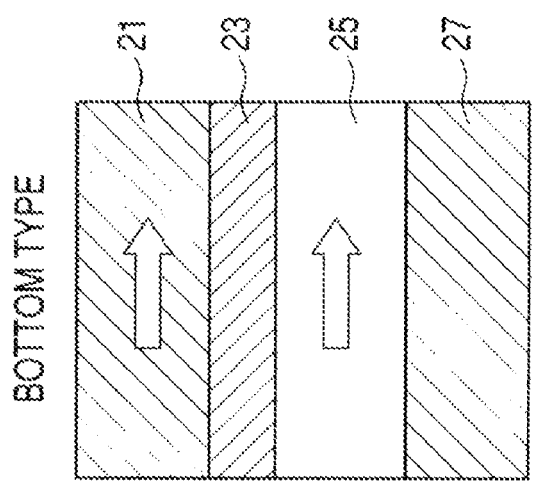
FIG. 2(a) BOTTOM TYPE
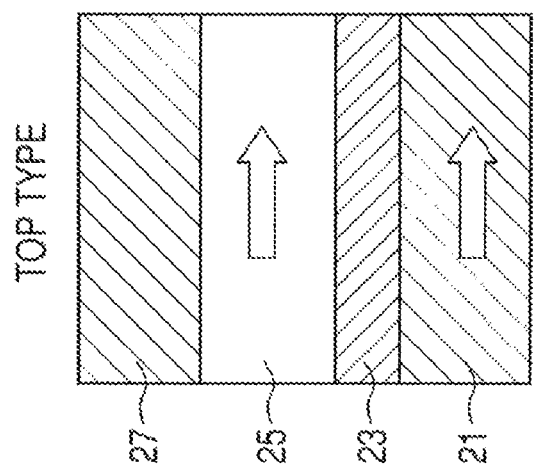
FIG. 2(b) TOP TYPE
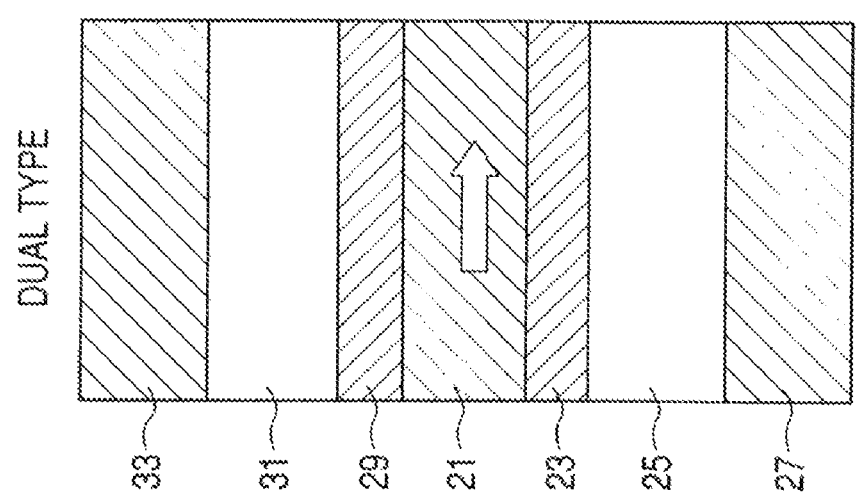
FIG. 2(c) DUAL TYPE ously filed Nov. 30, 2004 now abandoned. The entire disclosure of the prior application, application Ser. No. 10/998,597 is hereby incorporated by reference.

FILM AND METHOD FOR PRODUCING NANO-PARTICLES FOR MAGNETORESISTIVE DEVICE

This is a divisional of application Ser. No. 10/998,597 filed Nov. 30, 2004 now abandoned. The entire disclosure of the prior application, application Ser. No. 10/998,597 is hereby incorporated by reference.

BACKGROUND OF THE INVENTION

1. Technical Field

The present invention relates to a method of making nano-sized magnetic particles without using lithography, and a granular thin film produced by the method, for a read element of a magnetoresistive (MR) head.

2. Related Art

In the related art magnetic recording technology such as hard disk drives, a head is equipped with a reader and a writer that operate independently of one another. FIGS. 1(a) and (b) illustrate related art magnetic recording schemes. A recording medium 1 having a plurality of bits 3 and a track width 5 has a magnetization 7 parallel to the plane of the recording media. As a result, a magnetic flux is generated at the boundaries between the bits 3. This is commonly referred to as "longitudinal magnetic recording".

Information is written to the recording medium 1 by an inductive write element 9, and data is read from the recording medium 1 by a read element 11. Coils 16 supply a write current 17 to the inductive write element 9, and a read current 15 is supplied to the read element 11. An insulating layer (not illustrated for the sake of clarity) made of $Al_2O_3$ is deposited between the read element 11 and the write element 9 to avoid interference between the respective read and write signals.

The read element 11 is a sensor that operates by sensing the resistance change as the sensor magnetization changes direction. A shield 13 reduces the undesirable magnetic fields coming from the media and prevents the undesired flux of adjacent bits from interfering with the one of the bits 3 that is currently being read by the read element 11.

Due to requirements of increased bit and track density readable at a higher efficiency and speed, the related art magnetic recording scheme of FIG. 1(b) has been developed. In this related art scheme, the direction of magnetization 19 of the recording medium 1 is perpendicular to the plane of the recording medium 1. This is also known as "perpendicular magnetic recording". This design provides more compact and stable recorded data. Also a soft underlayer (not illustrated) is required to increase the writer magnetic field efficiency. Further an intermediate layer (not illustrated for the sake of clarity) can be used to control the exchange coupling between the recording layer 1 and soft underlayer.

FIGS. 2(a)-(c) illustrate various related art read heads for the above-described magnetic recording scheme, known as "spin valves". In the bottom type spin valve illustrated in FIG. 2(a), a free layer 21 operates as a sensor to read the recorded data from the recording medium 1. A spacer 23 is positioned between the free layer 21 and a composed pinned layer 25. On the other side of the composed pinned layer 25, there is an anti-ferromagnetic (AFM) layer 27. In the top type spin valve illustrated in FIG. 2(b), the position of the layers is reversed.

FIG. 2(c) illustrates a related art dual type spin valve. Layers 21 through 25 are substantially the same as described above with respect to FIGS. 2(a)-(b). However, an additional spacer 29 is provided on the other side of the free layer 21, upon which a second pinned layer 31 and a second AFM layer 33 are positioned. An extra signal provided by the second pinned layer 31 increases the resistance change $\Delta R$.

The direction of magnetization in the pinned layer 25 is substantially fixed, whereas the direction of magnetization in the free layer 21 can be changed, for example (but not by way of limitation) depending on the effect of an external magnetic field, such as the recording medium 1.

When the external magnetic field is applied to a reader, the magnetization direction of the free layer 21 is altered, or rotated, by an angle. When the flux is positive the magnetization of the free layer 21 is rotated upward, and when the flux is negative the magnetization direction of the free layer 21 is rotated downward. If the applied external field changes the free layer 21 magnetization direction to be aligned in the same way as the composed pinned layer 25, then the resistance between the layers is low, and electrons can more easily migrate between those layers 21, 25.

However, when the free layer 21 has a magnetization direction opposite to that of the composed pinned layer 25, the resistance between the layers is high. This high resistance occurs because it is more difficult for electrons to migrate between the layers 21, 25. Similar to the external field, the AFM layer 27 provides an exchange coupling and keeps the magnetization of composed pinned layer 25 substantially fixed.

The resistance change $\Delta R$ when the layers 21, 25 are parallel and anti-parallel should be high to have a highly sensitive reader. The media bit is decreasing in size, and the correspondingly, the magnetic field from the media bit is weaker. As a result, it is necessary for the free layer to sense this media flux having a reduced magnitude. Therefore, it is important for the related art free layer to have a reduced thickness to maintain sufficient sensitivity of the free layer. In order to provide a high-sensitivity sensor that can sense a very weak magnetic field, this is accomplished by reducing the free layer thickness to about 3 nm in the case of an areal recording density of 150 to 200 Gbits/in$^2$.

However, as a result of the thin free layer, there is a related art problem of a stronger spin transfer effect. The spin transfer effect is substantially inversely proportional to the thickness of the film. Thus, the stability of the free layer is reduced. Further, there is also a need for a high resistance change $\Delta R$ between the layers 21, 25 of the related art read head. As discussed in greater detail below, a thicker free layer results in a higher value of $\Delta R$.

The operation of the related art read head is now described in greater detail. In the recording media 1, flux is generated based on polarity of adjacent bits in the case of longitudinal magnetic recording. If two adjoining bits have negative polarity at their boundary the flux will be negative. On the other hand, if both of the bits have positive polarity at the boundary the flux will be positive. The magnitude of flux determines the angle of magnetization between the free layer and the pinned layer.

FIG. 3 illustrates a related art synthetic spin valve. The free layer 21, the spacer 23 and the AFM layer 27 are substantially the same as described above. However, the composed pinned layer 25 further includes a first pinned sublayer 35 separated from a second pinned sublayer 39 by a pinned layer spacer 37. The first pinned sublayer 35 operates according to the above-described principle with respect to the composed pinned layer 25. The second pinned sublayer 39 has an opposite spin state with respect to the first pinned sublayer 35. As a result, the total pinned layer moment is reduced due to anti-ferromagnetic coupling between the first pinned sublayer 35 and the second pinned sublayer 39. The read head has a composed pinned layer with a total magnetic flux close to zero, and thus greater stability and high pinning field can be achieved than with the single pinned layer structure. A buffer layer 28 is deposited below the AFM layer 27 for good spin-valve growth, and a cap 40 is provided on an upper surface of the free layer 21.

FIG. 4 illustrates the related art shielded read head. As noted above, it is important to avoid the sensing of unintended magnetic flux from adjacent bits during the reading of a given bit. A cap (protective layer) layer 40 is provided on an upper surface of the free layer 21 to protect the spin valve against oxidation before deposition of top shield 43, by electroplating in a separated system. Similarly, a bottom shield 45 is provided on a lower surface of the buffer layer 28.

Related art magnetic recording schemes use a current perpendicular to plane (CPP) head, where the sensing current flows perpendicular to the spin valve plane. As a result, the size of the read head can be reduced without a loss of the output read signal. Various related art spin valves that operate in the CPP scheme are illustrated in FIGS. 5(a)-(c), and are discussed in greater detail below. These spin valves structurally differ primarily in the composition of their spacer 23. The compositions and resulting difference in operation of these effects is discussed in greater detail below.

FIG. 5(a) illustrates a related art tunneling magnetoresistive (TMR) head for the CPP scheme. In the TMR head, the spacer 23 acts as an insulator, or tunnel barrier layer. Thus, in the case of a very thin barrier that is the spacer 23, the electrons can migrate from free layer 21 to pinned layer 25 or vice versa without change of spin direction. Current related art TMR heads have an increased magnetoresistance (MR) on the order of about 30-50%.

FIG. 5(b) illustrates a related art CPP-GMR head. In this case, the spacer 23 acts as a conductor. In the related art CPP-GMR head, there is a need for a large resistance change ΔR, and a moderate element resistance for having a high frequency response. A low free layer coercivity is also required so that a small media field can be detected. The pinning field should also have a high strength. Additional details of the CPP-GMR head are discussed in greater detail below.

FIG. 5(c) illustrates the related art ballistic magnetoresistance (BMR) head. In the spacer 23, which operates as an insulator, a ferromagnetic region 47 connects the pinned layer 25 to the free layer 21. The area of contact is on the order of a few nanometers. This is referred to as a nano-path or a nano-contact. As a result, there is a substantially high MR, due to electrons scattering at the domain wall created within this nano-contact. Other factors include the spin polarization of the ferromagnets, and the structure of the domain that is in nano-contact with the BMR head.

In the foregoing related art heads, the spacer 23 of the spin valve is an insulator for TMR, a conductor for GMR, and an insulator having a magnetic nano-contact for BMR. While related art TMR spacers are generally made of insulating materials such as alumina, related art GMR spacers are generally made of conductive metals, such as copper.

In the related art GMR head, resistance is minimized when the magnetization directions (or spin states) of the free layer 21 and the pinned layer 25 are parallel and is maximized when the magnetization directions are opposite. As noted above, the free layer 21 has a magnetization of which the direction can be changed. Thus, the GMR system avoids perturbation of the head output signal by minimizing the undesired switching of the pinned layer magnetization.

GMR depends on the degree of spin polarization of the pinned and free layers, and the angle between their respective magnetizations. Spin polarization depends on the difference between the spin state (up or down) in each of the free and pinned layers. As the free layer 21 receives the flux from the magnetic recording media, the free layer magnetization rotates by a small angle in one direction or the other, depending on the direction of flux. The change in resistance between the pinned layer 25 and the free layer 21 is proportional to angle between the moments of the free layer 21 and the pinned layer 25, as discussed above. There is a relationship between resistance change ΔR and efficiency of the reader.

As noted above, further increasing capacity of disk drives requires a small, high-sensitivity MR head. As discussed in S. Z. Hua et al., Phys. Review B67, 060401 (R) (2003), a high resistance can be obtained using the foregoing related BMR concept (i.e., connection of at least two ferromagnetic layers to one another via a nano-contact). The basis of the above-described BMR in disclosed in G. Tatara et al., Phys. Review Letters, Vol. 83, 2030 (1999), based on the thin domain wall between the two ferromagnetic layers.

In the related art, nano-sized magnetic particles can be made by using lithography. In another related art method of making the particles, Japanese Patent Application No. 09-289345 discloses a GMR magnetic head in which a granular layer 13 is formed between laminated non-magnetic metal layers. The granular film 13 is formed by sputtering, using a single ion beam generated in a deposition chamber. However, there is a related art problem in that the beam cannot stay focused, and is subject to repulsion forces. As a result, the beam is dispersed.

Accordingly, the film produced by the related art process has various problems and disadvantages. For example, but not by way of limitation, as shown in Table 1 of U.S. Pat. No. 6,621,857, which claims foreign priority to Japanese Patent Application No. 2000-132996, for a granular film with a particle size of 4 nm, the coercivity is on the order of about 200 KA/m, or 2,500 Oersteds (Oe). Therefore, it cannot be used for a magnetic read head due to its high coercivity.

The related art BMR sensor must have a coercivity in the range of about 10 to 50 Oe. As noted above, the related art produces a layer having a coercivity of about 2,500 Oe. Thus, the related art granular film and method of making the film cannot produce a granular film for use with the related art BMR sensor.

Accordingly, there is an unmet need for a granular film having a low coercivity, and a method to produce a high-quality film that does not experience the related art dispersion problem.

SUMMARY OF THE INVENTION

It is an object of the present invention to overcome the related art problems and disadvantages. However, such an object, or any object, need not be achieved in the present invention.

Accordingly, a method of producing a granular film is provided, including exposing a target to a first ion beam to generate sputtered particles, the target including a non-magnetic material and a magnetic material. Additionally, the method includes at a substrate, receiving the sputtered particles including the magnetic material and the non-magnetic material; and treating the substrate with a second ion beam to form the granular film, wherein the granular film has a coercivity field of less than about 30 Oe.

Further, a magnetic element for reading a recording medium is provided, comprising a granular spacer sandwiched between a free layer having an adjustable magnetization direction in response to an external field and a pinned layer having a substantially fixed magnetization direction, the granular spacer comprising an insulative matrix and conductive grains, wherein at least one of (a) the interlayer coupling between the free layer and the pinned layer no more than about 50 Oe, and (b) the coercivity of the free layer is no more than about 30 Oe. The foregoing may also be implemented in a device.

BRIEF DESCRIPTION OF THE DRAWINGS

FIGS. 1(a) and (b) illustrates a related art magnetic recording scheme having in-plane and perpendicular-to-plane magnetization, respectively;

FIGS. 2(a)-(c) illustrate related art bottom, top and dual type spin valves;

DETAILED DESCRIPTION OF THE INVENTION

Figure 3:
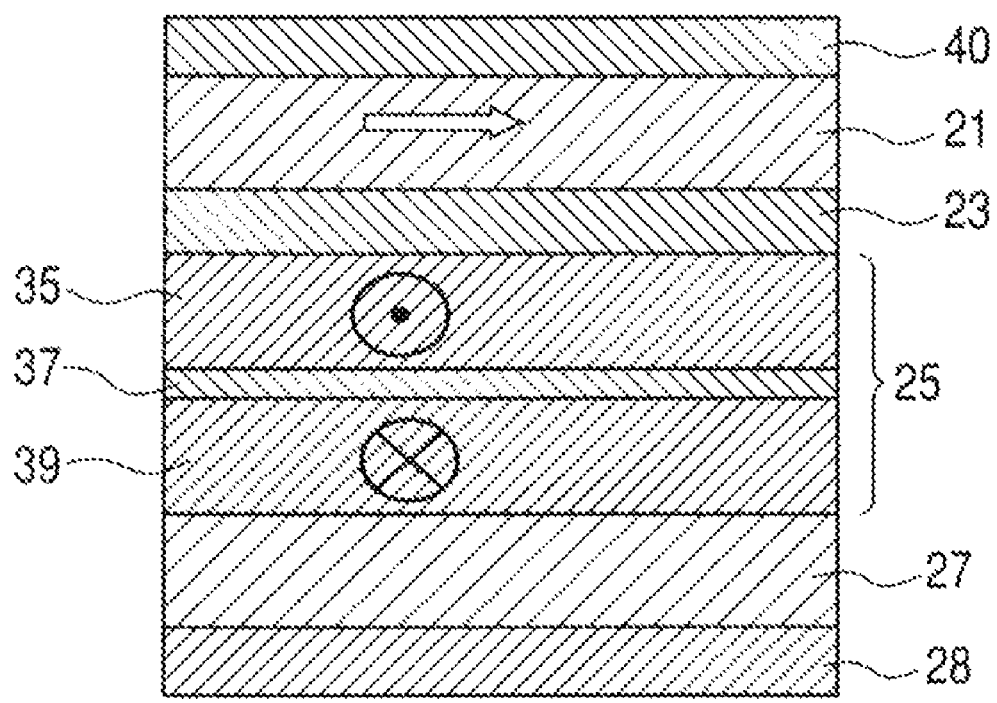
FIG. 3 illustrates a related art synthetic spin valve for a magnetoresistive read head.
Figure 4:
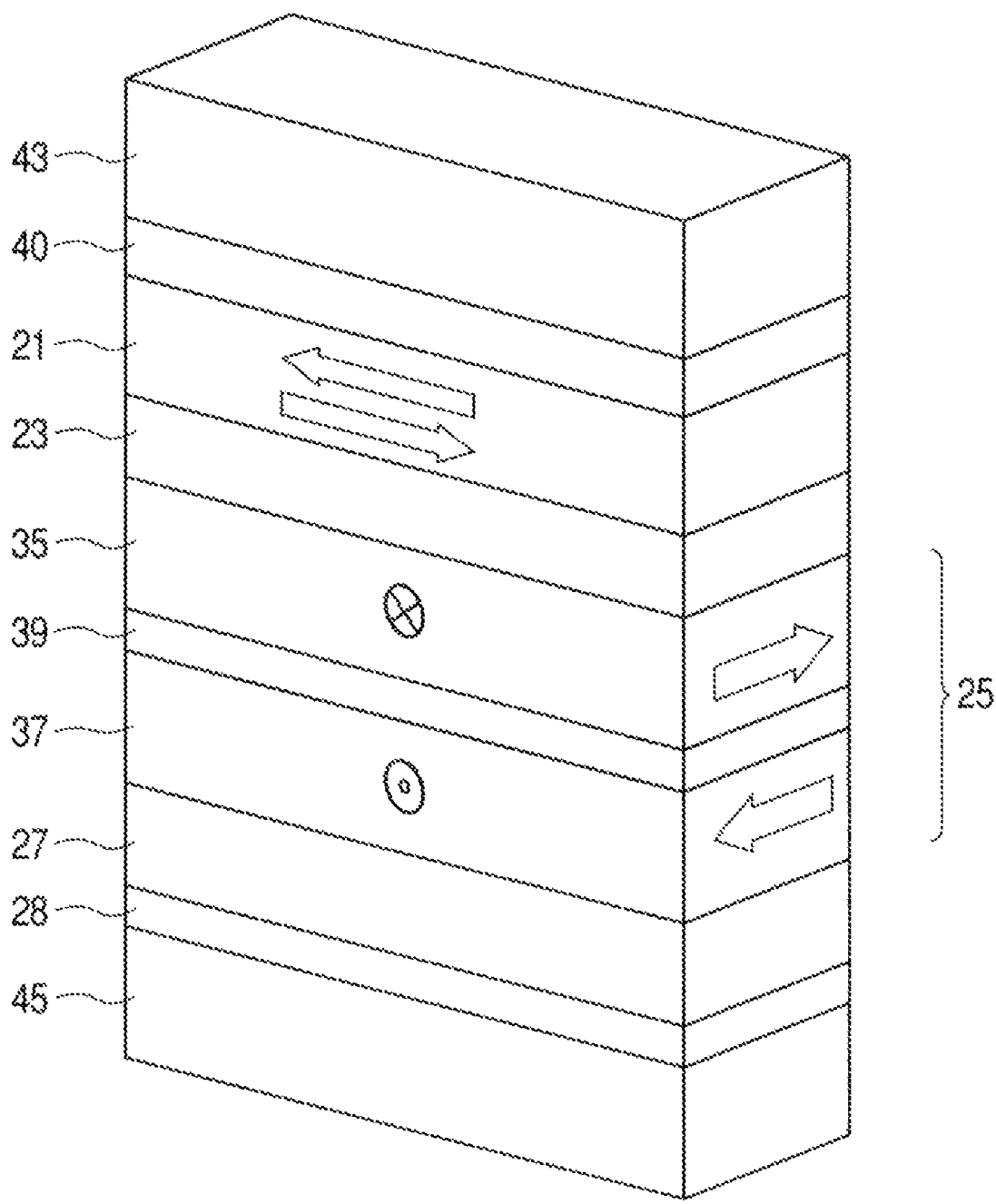
FIG. 4 illustrates a related art synthetic read head having a shielded structure.
Figure 5A:
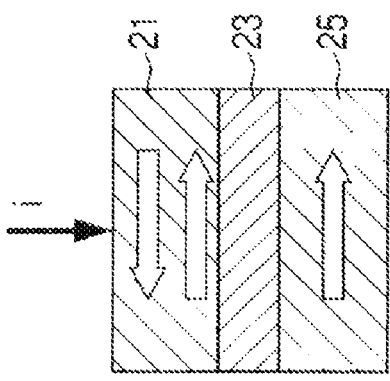
FIGS. 5(a)-(c) illustrates various related art magnetic sensor systems.
Figure 5B:
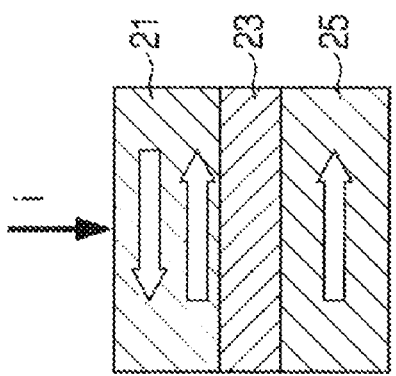
Figure 5C:
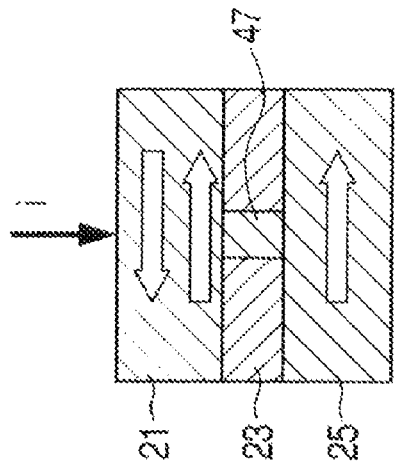

A magnetic sensor (read head) for reading a recording medium having a spin valve structure comprises a granular spacer, a free layer and a pinned layer. The granular spacer is sandwiched between the free layer and the pinned layer. The free layer has an adjustable magnetization direction in response to an external field generated from a medium like a hard disc, and the pinned layer has a substantially fixed magnetization direction, The granular spacer comprises an insulating matrix and magnetic grains. At least one of magnetic grains serves as a nano-contact.

The foregoing film can be used in a magnetoresistive device. For example, but not by way of limitation, the granular film can be used as a spacer in a BMR sensor when the matrix is insulative. The structure of the BMR sensor is discussed above, except for the composition of the spacer.

In the present invention, the term "read head" is used interchangeably with the term "magnetic sensor", and refers to the overall apparatus for sensing data from a recording media. In this regard, "magnetic sensor" is one particular type of "magnetic element", and where magnetic sensors are used in the specification, other magnetic elements (e.g., random access memory or the like) may be substituted therein, as would be known by one of ordinary skill in the art.

Additionally, the term "magnetic element" is defined to include "magnetoresistance effect element" and/or "magnetoresistance element" as is understand by those of ordinary skill in this technical field. However, the present invention is not limited thereto, and other definitions as would be understood by those of ordinary skill in the art may be substituted therefore without narrowing the scope of the invention. Further, the term "spin valve" is used to refer to the specific structural makeup of the read head layers.

In the present invention, the spacer thickness is between about 2 nm and 10 nm. The BMR sensor has an interlayer coupling between the free layer and the pinned layer of no more than about 50 Oe, and preferably no more than about 20 Oe. Further, the free layer has a coercivity no more than about 30 Oe, and preferably, no more than about 20 Oe.

Generally, the BMR sensor includes the granular spacer separating a first ferromagnetic layer from a second ferromagnetic layer. The spacer is made by sputtering involving a main ion beam acting upon a substrate (also referred to herein as a target) and an assisted ion beam generated to act upon the sputtered material deposited on the substrate.

The target has at least two materials, such that one is magnetic and another is a non-magnetic material that is an isolator or a metal having higher oxidation rate than the magnetic material. For example, but not by way of limitation, the target may be a target having an non-magnetic matrix with conductive magnetic material chips thereon, or a target having a lot of lumps of non-magnetic and magnetic material.

The granular spacer includes the above-disclosed conductive nanoparticles having a diameter of no more than about 10 nm, and preferably, about 5 nm or less, wherein the thickness of the spacer is less than about 5 nm. The magnetic grain (nano-particle) comprises one of Ni, Co, Fe, and the insulating matrix (insulator) can use an oxide or a nitride such as $Al_2O_3$, AlN, $SiO_2$ and $Si_3N_4$.

More specifically, in the present invention, the BMR sensor includes a pinned layer and a free layer, each of which includes one or more ferromagnetic layers that comprise one of Ni, Fe and Co. For example, but not by way of limitation, a composed pinned layer and/or a composed free layer may be part of the BMR sensor. Because the present invention is directed to a BMR sensor, the sensing current flows in the multilayer thickness, and electrodes on bottom and top shields of the MR element are provided.

The composed layer comprises a least two ferromagnetic layers coupled antiferromagnetically through a thin layer made of at least one of Cu, Ag, Au, In, Pt, Pd, Ru and Rh. The ferromagnetic layer comprises one of Ni, Co and Fe.

In addition to the pinned layer, an antiferromagnetic (AFM) layer may be provided at a side of the pinned layer opposite the spacer between the pinned layer and the free layer. The AFM layer includes material like an Mn alloy, such as X—Mn or XY—Mn, where X and Y are made of Pt, Ir, Pd, Ru, Rh, Os, Fe and Ni, and X is different from Y and preferably PtMn, or IrMn. As disclosed above with respect to the related art, the AFM layer substantially (i.e., except for external magnetization effects, such as "noise" from the device in which the present invention is applied) fixes the pinned layer magnetization direction by exchange coupling. The thickness of the AFM layer is between about 5 to 20 nm.

As an alternative to the above-disclosed AFM layer, a combination of a pinned layer and a hard magnet may be employed. For example, but not by way of limitation, the pinned layer may be made of at least one of Co, Fe and Ni, antiferromagnetically coupled to a hard magnetic layer including at least one of CoSm, XPt, XPtCr and XPtCrB, where X=Fe, Co or FeCo, preferably CoPt, FePt and CoCrPt.

Thus, the present invention is directed to a thin film layer, usable in a BMR sensor in one embodiment, and a method for making the film and BMR sensor.

Figure 6:
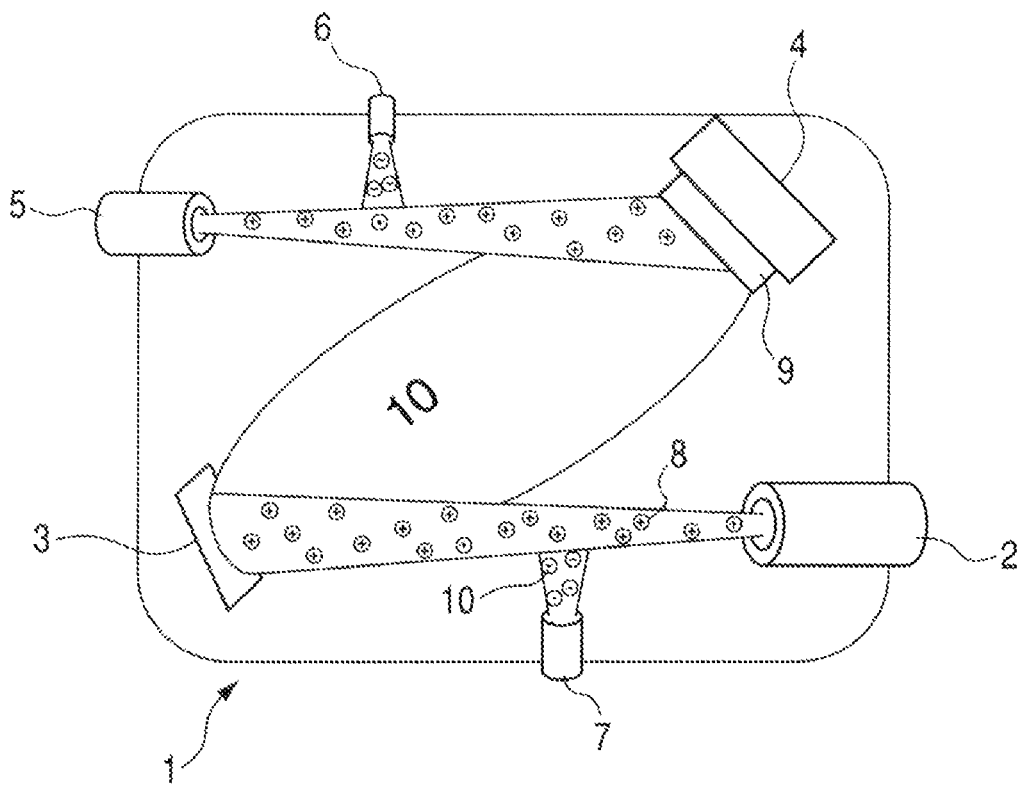
FIG. 6 illustrates an apparatus for making nano-sized magnetic particles for a thin film layer according to an exemplary, non-limiting embodiment of the present invention.

FIG. 6 illustrates a vacuum deposition chamber 1 for producing the embodiment of the present invention, according to the method of the present invention. A main ion beam source 2 generates a main ion beam (first ion beam) having ions 8. For example, but not by way of limitation, argon gas may be used in the main ion beam. A composite target (or plate) 3 includes at least two materials, including an insulator (e.g., $Al_2O_3$, AlN and $SiO_2$) and homogeneously spaced magnetic material chips (e.g., Ni or CoFe) stacked on the surface of the composite target 3.

While the target 3 is illustrated as square in shape, other shapes may also be used. Further, the amount of magnetic material chips may be varied to cover a prescribed percentage of the insulator (e.g., an alumina insulator). For example, but not by way of limitation, about 10 to 40 percent of the surface of the insulator matrix may be covered with magnetized material chips. As a result of the ions 8 provided to the composite target 3, sputtered particles 10 of the magnetic material and the insulator are generated.

A substrate 9 positioned on a holder 4 receives the sputtered particles 10, which are deposited thereon. The sputtered particles of the metal on the substrate form the grains (nano-particles), and the sputtered particles of the insulator on substrate form the isolating matrix surrounding the grains, so as to form a granular spacer. At least one of the grains reaches both surfaces of the granular spacer and thus contacts both the pinned layer and the free layer.

Further, an assisted beam 5 generates ions substantially simultaneously with or after the sputtering of particles 10 on substrate 9. These ions from the assisted beam 5 are projected in the direction of the substrate 9 and holder 4. This assisted beam 5 further optimizes the deposition process by improving the surface morphology of the substrate 9.

Additionally, the assisted beam 5 results in good stoichiometry, and correspondingly, good crystal growth. For example, but not by way of limitation, the assisted beam 5 helps to produce good alumina in the form of $Al_2O_3$, as opposed to the undesirable AlO product.

In addition, the ion beams generated by the main ion beam source 2 and the assisted beam 5 are acted upon by neutralizers 7 and 6, respectively. Each of the neutralizers 6, 7 generate oppositely-charged particles 10 (e.g., electrons) to those generated by the ion beam to project the ions of the first beam and/or the second beam. While both neutralizers 6, 7 are shown in FIG. 1, one or the other of the neutralizers may be used, and both neutralizers are not required.

The neutralizers prevent the related art dispersion problem by allowing the beam to stay homogeneous and focused, and avoid the related art repulsion problem. Thus, a proper beam density can be obtained. Further, the neutralizers 6, 7 prevent the target 3 from discharging due to the accumulation of positive ions near the surface of the target.

Figure 7:
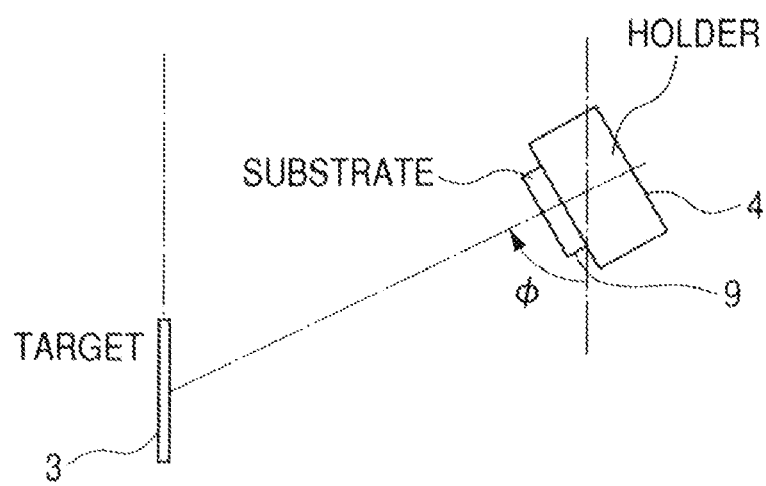
FIG. 7 illustrates a varying an angular relationship between a position of a target as related to a substrate according to the exemplary, non-limiting embodiment of the present invention.

The geometry illustrated in FIG. 6 is merely exemplary, and other geometries having the components in different positions and/or sizes may also be used in the present invention. As shown in FIG. 7, the angle between the target, substrate and holder may be varied between about 0 and 180 degrees.

In a spacer layer of a BMR sensor, the surface can be made substantially smoother by the use of the assisted beam 5. As a result, the present invention is used in providing the spacer layer of the related art BMR sensor having the above-discussed structure, and can also be applied to other devices that use the MR effect, such as (but not limited to) MRAM and the magnetic field sensor. Due to the improved thin film based on the foregoing method of making, the spacer of the BMR sensor is improved, as discussed further below.

The present invention solves the related art problem of producing isolated nano-particles having different sizes and adjustable intrinsic properties. For example, but not by way of limitation, as illustrated in FIG. 8, a target 3 with the $Al_2O_3$ insulator matrix having 30 percent nickel on the total surface area is compared with a target 3 of the $Al_2O_3$ insulator matrix having 20 percent nickel on the total surface area.

Figure 8:
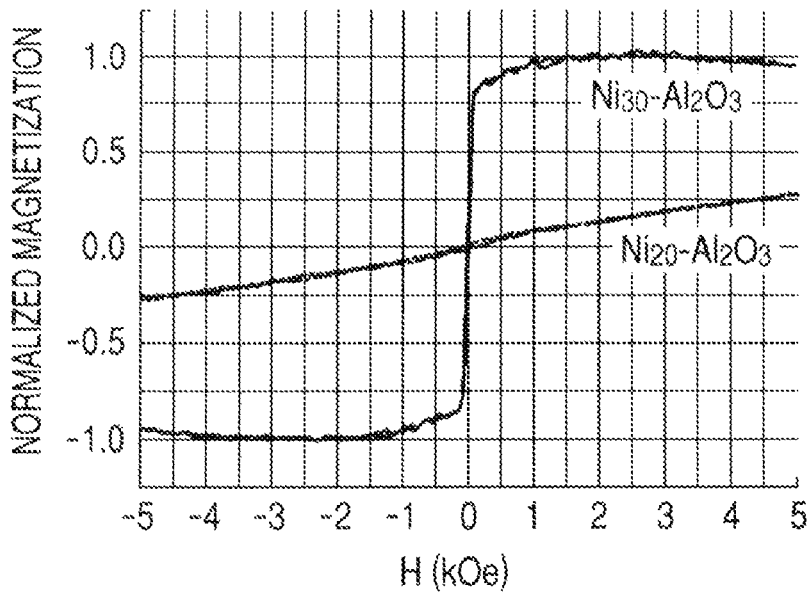
FIG. 8 illustrates the relationship between normalized magnetization and coercivity as measured for two samples according to the present invention.

In FIG. 8, the 20 percent Ni sample has a super-paramagnetic state, where the state of magnetization is substantially linear with respect to the applied field. On the other hand, the 30% Ni sample has a ferromagnetic state (i.e., hysterisis loop). The conditions of the deposition chamber for the results obtained in both cases shown in FIG. 8 are shown below in Table 1.

TABLE 1

| Main beam | |
|---|---|
| Beam current (mA) | 320 |
| Grid voltage (V) | 1200 |
| Negative Grid 1 (V) | 325 |
| Negative Grid 2 (V) | 50 |
| RF Power (W) | 162 |
| Ar pressure (sccm) | 20 |
| Neutralizer | |
| Current (mA) | 350 |
| Ar pressure (sccm) | 4 |

Figure 9:
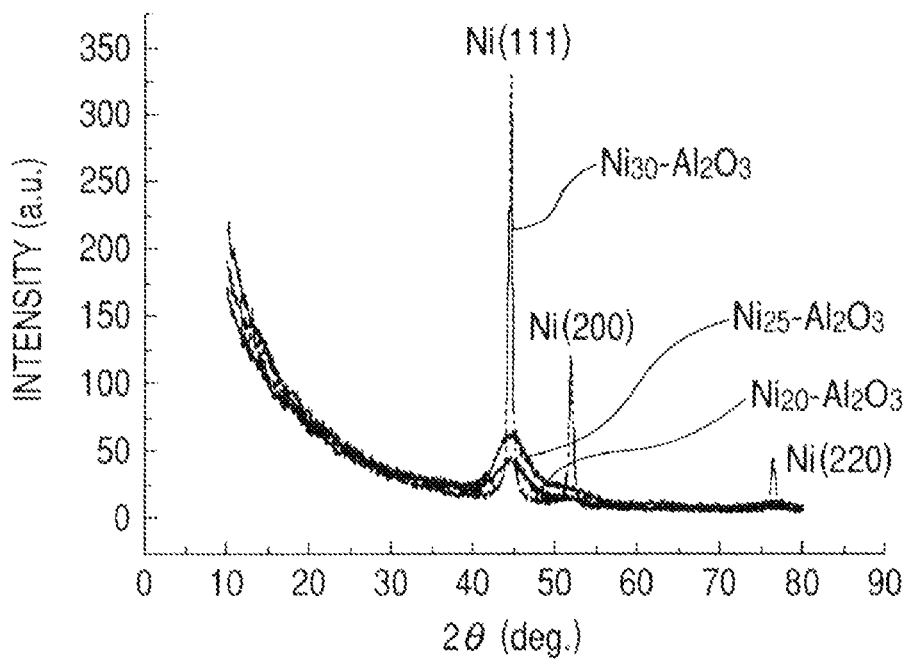
FIG. 9 illustrates X-ray diffraction as a function of the angle of measurement for two samples according to the present invention.

Additionally, the crystallographic structure (111 orientation in the case of Ni) obtained by the present invention is improved, as shown in FIG. 9. For the above-described two samples of FIG. 8, X-ray diffraction was used to measure the diffraction intensity as a function of angle of measurement. The 30 percent sample had a substantially higher (111) peak intensity than the 20 percent sample (about 44 degrees).

Figure 10:
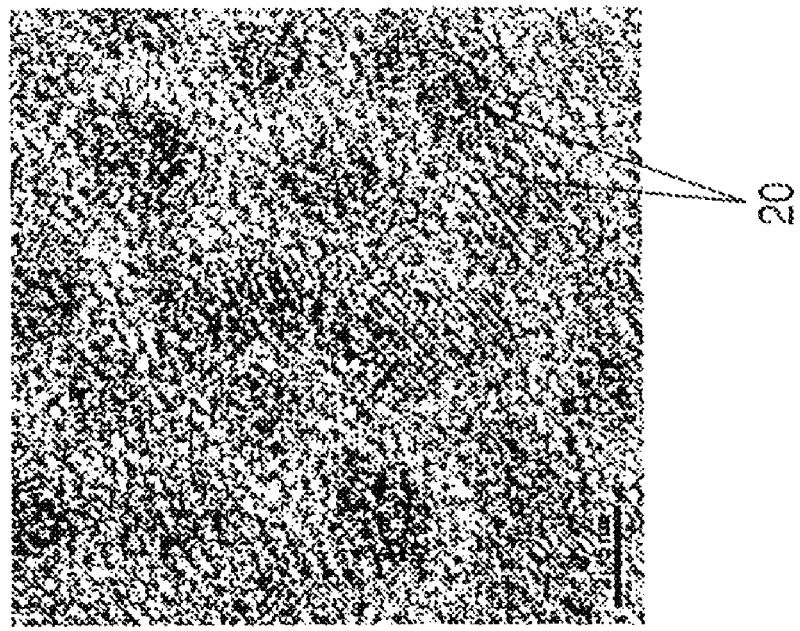
FIGS. 10(a)-(b) illustrate particles produced according to the exemplary, non-limiting method of the present invention.
Figure 10A:
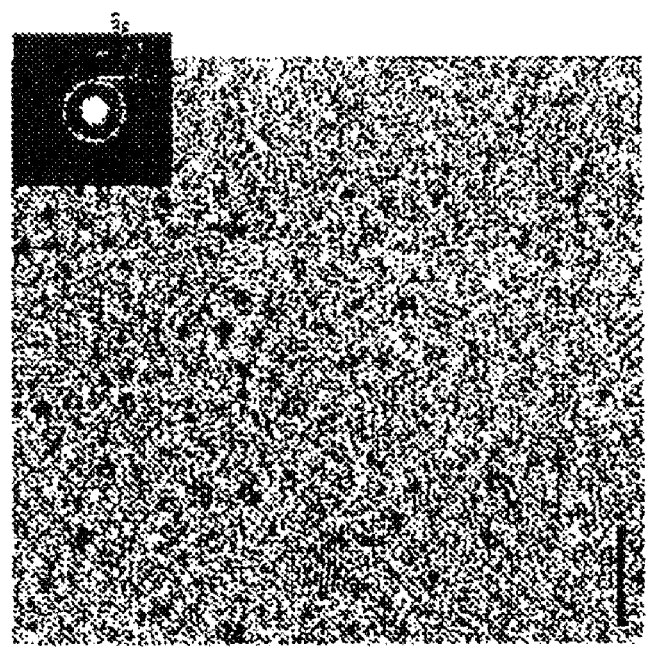

As an illustration of the results of the foregoing exemplary, non-limiting embodiment of the present invention, FIGS. 10(*a*)-(*b*) illustrate images obtained using transmission electron microscopy (TEM). FIG. 10(*a*) illustrates a TEM image of Ni nano-particles (about 20 percent Ni in the $Al_2O_3$ matrix) obtained by ion beam sputtering, and FIG. 10(*b*) illustrates an enlarged area of the foregoing TEM image.

Well-separated particles having a size of about 2 nm can be made using the exemplary, non-limiting embodiment of the present invention. As shown in FIG. 10(*b*), excellent crystal growth is obtained, and lattice fringes 20 are observed.

In addition to the foregoing issues, the exemplary, non-limiting embodiment of the present invention is directed to magnetoresistive devices having a nano-constricted area (such as BMR), and therefore, free layer coercivity and the interlayer coupling between the free layer and the pinned layer must be minimized. The use of the assisted beam 5 of the present invention modifies the surface morphology of the spacer layer, so as to substantially reduce the coercivity and interlayer coupling.

In an implementation of the foregoing exemplary, non-limiting embodiment of the present invention, a spin valve is produced for an MR read head. The process of making the spin valve is as disclosed below.

First, the pinned layer and all layers therebelow are deposited by DC or RF-sputtering a bottom part of spin valve that includes:

NiCr (50)/PtMn (130)/CoFe (30)/Ru (8)/CoFe(40). The thicknesses of the respective layers, in parentheses, are in Angstroms. Once this bottom part of the spin valve has been made by related art methods, the resulting product is transferred to ion beam sputtering system of the present invention.

At this point, a rough etching removes 10 Å extra-CoFe and provides a cleaning of the upper surface of the pinned layer.

Then, the following structure is deposited in the deposition chamber of the present invention, by DC or RF-sputtering, except for the Ni—Al$_2$O$_3$ granular spacer, without breaking the vacuum:

Ni—Al$_2$O$_3$ (15)/NiFe (30)/Ta (20). The total spin valve with the nanoconstricted spacer was annealed at 270 degrees Celsius for 3 hours and with 8 kOe applied magnetic field.

By the foregoing method, three samples were made, with the deposition conditions for spacer Ni—Al$_2$O$_3$ being varied in each sample as disclosed below and shown in TABLE 2. A reference sample deposited with ion beam sputtering without using assisted beam, and three other samples deposited with different assisted beam currents (140 and 160 mA). These values correspond to a beam power of 117 and 132 W respectively.

As can be seen from TABLE 2, the free layer coercivity H$_c$ and interlayer coupling H$_{inter}$ between the pinned layer and free layer are strongly dependent on assisted beam conditions. Without the assisted beam, H$_{inter}$ is very high which makes it impossible to use the reference sample in the read head and other magnetoresistive devices. As compared with the related art BMR requirement for free layer coercivity of 20 to 30 Oe, the reference sample has a Hc value of 75 Oe. Note that a free layer coercivity smaller than 20 Oe is even better. Further, the above-noted prior art has a value of about 2,500 Oe and thus is substantially high for use in a BMR sensor.

With the assisted beam at 140 mA, there is a small decrease of H$_{inter}$ for low current. For example, coercivity decreases to 30 Oe (or about 60 percent) and interlayer coupling decreases to 360 Oe (or about 11 percent).

However, for a current of more than 140 mA a strong decrease of H$_c$ and H$_{inter}$ was observed. For example, coercivity decreased by about 33 percent from 30 Oe to 20 Oe, and interlayer coupling decreased from about 360 to 25, or about 93 percent. This unexpected decrease arises from an increase of only 20 mA in the assisted beam current.

TABLE 2

| Assisted beam Current (mA) | Hc (Oe) | Hinter (Oe) |
|---|---|---|
| 0 | 75 | 405 |
| 140 | 30 | 360 |
| 160 | 20 | 25 |

The related art, as represented by the reference sample in which there is no use of the assisted beam, generates results having a substantially high Hc and Hinter as compared with the unexpected and strong decrease in both parameters when the assisted beam is used. In a BMR device employing such a spacer layer, the decreased values of Hc and Hinter are due to an improved smoothness between the free layer and the spacer.

In the present invention, preferably the top surface of the granular layer is etched before depositing a ferromagnetic layer on a granular film. However, the present invention is not limited thereto, and other methods may be applied in which such an etching is not performed.

In another exemplary, non-limiting embodiment of the present invention, another method is provided for making the nano-particles. According to this method, a target is used that is made of a non-magnetic conductive material, on which magnetic chips are uniformly arranged. After deposition of the magnetic and non-magnetic materials simultaneously by using the above-described main ion beam and assisted beam, oxidation is performed to oxidize only the non-magnetic conductive part without affecting the magnetic nano-particles.

Optionally, a smooth etching is used to make a clean upper surface of the nano-contact. While different oxidation processes can be used, natural oxidation is preferred. The natural oxidation process is performed by flowing oxygen gas after deposition. In this case, the non-magnetic conductive material should be selected from a category having a substantially higher oxidation rate than the magnetic material.

The deposition of the magnetoresistive device is made in one or multi-deposition chambers. For example, a plasma-sputtering chamber is used to deposited the buffer layer AFM layer and a single or synthetic pinned layer. Then an ion beam deposition chamber is provided to deposit the granular spacer after cleaning the top surface of the pinned layer using an ion etching.

The free layer and capping layer can be deposited using the same ion beam chamber without breaking the vacuum or an additional different deposition chamber. The spin valve film with granular spacer can be made in a multi-steps deposition process.

Additionally, the foregoing embodiments are generally directed to a magnetoresistive element for a magnetoresistive read head. This magnetoresistive read head can optionally be used in any of a number of devices. For example, but not by way of limitation, as discussed above, the read head can be included in a hard disk drive (HDD) magnetic recording device. However, the present invention is not limited thereto, and other devices that use the ballistic magnetoresistive effect may also comprise the magnetoresistive element of the present invention. For example, but not by way of limitation, a magnetic random access memory (i.e., a magnetic memory device provided with a nano-contact structure, or a device) may also employ the present invention. Such applications of the present invention are within the scope of the present invention.

The present invention is not limited to the specific above-described embodiments. It is contemplated that numerous modifications may be made to the present invention without departing from the spirit and scope of the invention as defined in the following claims.

The invention claimed is:

1. A magnetic element comprising:
    a granular spacer sandwiched between a free layer having an adjustable magnetization direction in response to an external field and a pinned layer having a substantially fixed magnetization direction, said granular spacer comprising an insulative matrix and magnetic grains, wherein at least one of (a) the interlayer coupling between said free layer and said pinned layer is no more than about 50 Oe, and (b) the coercivity of said free layer is no more than about 30 Oe.

2. The magnetic element of claim 1, wherein said granular spacer is made by the following steps:
    exposing a composed structure to a first beam of ions to generate sputtered particles, said composed structure including a plurality of chips of a magnetic material positioned on a target;
    at a substrate including said pinned layer, receiving said sputtered particles including said magnetic material and said insulator;
    treating said substrate with a second beam of ions to form said granular spacer, said sputtered magnetic particles forming said magnetic grains, and said sputtered insulator forming said insulative matrix.

3. The magnetic element of claim 1, wherein one of said magnetic grains comprises a nanoparticle having a diameter less than about 10 nm.

4. The magnetic element of claim 3, wherein said magnetic grains comprise crystalline nanoparticles having a diameter less than about 5 nm.

5. The magnetic element of claim 1, wherein said granular spacer has a thickness of less than about 5 nm.

6. The magnetic element of claim 1, wherein the interlayer coupling between said free layer and said pinned layer is less than about 50 Oe.

7. The magnetic element of claim 1, wherein the coercivity of said free layer is less than about 30 Oe.

8. The magnetic element of claim 1, wherein said pinned layer and said free layer each comprise at least one ferromagnetic layer.

9. The magnetic element of claim 8, wherein at least one of said pinned layer and said free layer comprises a plurality of ferromagnetic layers laminated via a non-conductive laminating layer comprising at least one of Cu, Ag, Au, Ru and Rh.

10. The magnetic element of claim 1, further comprising an antiferromagnetic (AFM) layer positioned on said pinned layer opposite said granular spacer, said AFM layer comprising at least one Mn alloy.

11. The magnetic element of claim 10, wherein said at least one Mn alloy comprises PtMn and IrMn.

12. The magnetic element of claim 1, wherein said pinned layer comprises a ferromagnetic layer including at least one of Co, Fe and Ni, antiferromagnetically coupled to a hard magnetic layer comprising at least one of CoSm, XPt, XPtCr and XPtCrB, where X is at least one of Fe, Co and FeCo.

13. The magnetic element of claim 1, wherein a sensing current flows between said free layer and said pinned layer via electrodes at respective top and bottom sides of said magnetic element.

14. The magnetic element of claim 1, wherein said magnetic element is one of a bottom type, a top type and a dual type.

15. A device comprising:
a granular spacer sandwiched between a free layer having an adjustable magnetization direction in response to an external field and a pinned layer having a substantially fixed magnetization direction, said granular spacer comprising an insulative matrix and magnetic grains, wherein at least one of (a) the interlayer coupling between said free layer and said pinned layer is no more than about 50 Oe, and (b) the coercivity of said free layer is no more than about 30 Oe.

* * * * *